(12) United States Patent
Choi

(10) Patent No.: US 6,861,329 B2
(45) Date of Patent: Mar. 1, 2005

(54) METHOD OF MANUFACTURING CAPACITOR IN SEMICONDUCTOR DEVICES

(75) Inventor: Jae Sung Choi, Cheongjoo-Shi (KR)

(73) Assignee: Hynix Semiconductor Inc., Ichon-Shi (KR)

(*) Notice: Subject to any disclaimer, the term of this patent is extended or adjusted under 35 U.S.C. 154(b) by 0 days.

(21) Appl. No.: 10/612,073

(22) Filed: Jul. 3, 2003

(65) Prior Publication Data
US 2004/0137691 A1 Jul. 15, 2004

(30) Foreign Application Priority Data
Jul. 11, 2002 (KR) .................................. 10-2002-40478

(51) Int. Cl.⁷ .............................................. H01L 21/20
(52) U.S. Cl. ...................... 438/386; 438/239; 438/240; 438/387; 438/692
(58) Field of Search ................................ 438/239, 240, 438/386, 387, 692

(56) References Cited

U.S. PATENT DOCUMENTS 6,528,838 B1    3/2003  Ng et al.
6,534,374 B2    3/2003  Johnson et al.

*Primary Examiner*—Long Pham
(74) *Attorney, Agent, or Firm*—Piper Rudnick LLP

(57) ABSTRACT

Disclosed is a method of manufacturing a MIM (metal-insulator-metal) capacitor using copper as a lower electrode. The MIM capacitor is manufactured by the following processes. A lower copper electrode is formed on a substrate. A photoresist pattern having a capacitor hole through which the lower copper electrode is exposed, is then formed. Next, the surface of the photoresist pattern is hardened to form a photoresist hardening layer. Thereafter, a capacitor dielectric film and an upper electrode material layer are formed on the photoresist hardening layer including the capacitor hole. The upper electrode material layer and the capacitor dielectric film are then polished by means of chemical mechanical polishing process to form an upper electrode within the capacitor hole. Finally, the photoresist pattern including the photoresist hardening layer is removed. As such, the MIM capacitor is manufactured without using the mask process and the etch process. Therefore, it is possible to prevent decrease in the reliability and yield of the device due to etch damage of the lower copper electrode.

7 Claims, 2 Drawing Sheets

METHOD OF MANUFACTURING CAPACITOR IN SEMICONDUCTOR DEVICES

BACKGROUND OF THE INVENTION

1. Field of the Invention

The present invention relates to a method of manufacturing capacitor in semiconductor devices, and more particularly, to a method of manufacturing a capacitor in a semiconductor devices capable of preventing decrease in the reliability and yield of the devices due to etch damage of a lower copper electrode, by forming a MIM (metal-insulator-metal) capacitor using copper as the lower electrode by means of chemical mechanical polishing process without using mask process and etch process.

2. Background of the Related Art

Generally, as the semiconductor industry shifts to an ultra large-scale integration (ULSI), the geometry of the device is continuously narrowed to a sub-half-micron region while the circuit density such as improved performance and reliability is also increased. In suit with this request, in forming metal lines of the semiconductor devices, a copper thin film has been used as an interconnection material useful for the integration circuit. The reason why the copper thin film is used as the interconnection material is that it can improve reliability of the semiconductor devices since the copper thin film has a higher melting point than aluminum and has high resistance to electro-migration (EM), and increase the signal transfer speed since it has a low resistivity. Further, the damascene scheme, by which a via contact hole for electrically connecting the lower layer and the trench where the metal line is located are formed at the same time, has been widely applied to the process of forming the copper line in the semiconductor devices. A metal interlayer insulating film in which the damascene pattern will be formed is formed of a low dielectric insulating material having a low dielectric constant.

Meanwhile, in the MIM (metal-insulator-metal) capacitor of the semiconductor device using the copper line, copper is used as the lower electrode and materials such as Ti, TiN, Ta, TaN, and the like are used as the lower electrode. A conventional method of manufacturing the MIM capacitor includes sequentially performing the processes of forming the lower copper electrode by means of the damascene scheme, depositing a capacitor dielectric film on the entire structure including the lower copper electrode, an upper electrode material layer on the capacitor dielectric film, forming and upper electrode mask layer on the upper electrode material layer by means of photolithography process and etching the upper electrode material layer and the capacitor dielectric film by means of etch process using the mask layer, thus forming the upper electrode.

However, in the above conventional process, the process of etching the upper electrode material layer and the capacitor dielectric film is used. During the etch process, there occurs a difficulty in controlling the processes since etch damage of the lower copper electrode occurs and copper polymer that is difficult to remove is generated. Further, damage of the lower electrode and generation of copper polymer ultimately adversely affects the yield of the devices.

SUMMARY OF THE INVENTION

Accordingly, the present invention is contrived to substantially obviate one or more problems due to limitations and disadvantages of the related art, and an object of the present invention is to provide a method of manufacturing a capacitor in semiconductor devices capable of preventing decrease in the reliability and yield of the devices due to etch damage of a lower copper electrode, by forming a MIM (metal-insulator-metal) capacitor using copper as the lower electrode by means of chemical mechanical polishing process without using mask process and etch process.

In a preferred embodiment of the present invention, the method of manufacturing the capacitor in the semiconductor devices is characterized in that it comprises the steps of forming a lower copper electrode on a substrate, forming a photoresist pattern having a capacitor hole through which the lower copper electrode is exposed, hardening the surface of the photoresist pattern to form a photoresist hardening layer, forming a capacitor dielectric film and an upper electrode material layer on the photoresist hardening layer including the capacitor hole, polishing the upper electrode material layer and the capacitor dielectric film by means of chemical mechanical polishing process to form an upper electrode within the capacitor hole, and removing the photoresist pattern including the photoresist hardening layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

A method of manufacturing a capacitor in semiconductor devices according to a preferred embodiment of the present invention will be below described in detail by reference to FIG. 1A~FIG. 1F.

Figure 1A:
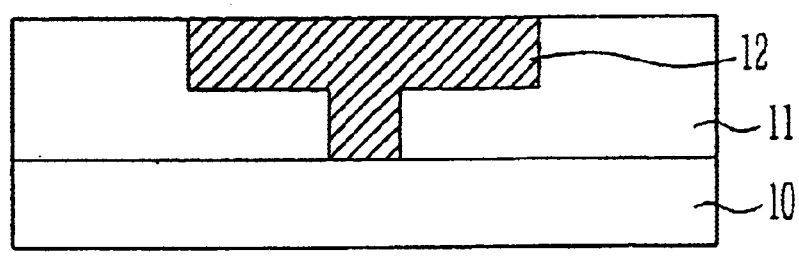
FIG. 1A~FIG. 1F are cross-sectional views of semiconductor devices for explaining a method of manufacturing a capacitor in the device according to a preferred embodiment of the present invention.

Referring to FIG. 1A, a substrate 10 in which the bottom layer for constituting the semiconductor device is provided. An interlayer insulating film 11 is then formed on the substrate 10. Next, a lower copper electrode 12 is formed in the interlayer insulating film 11 by means of the damascene scheme.

Figure 1B:
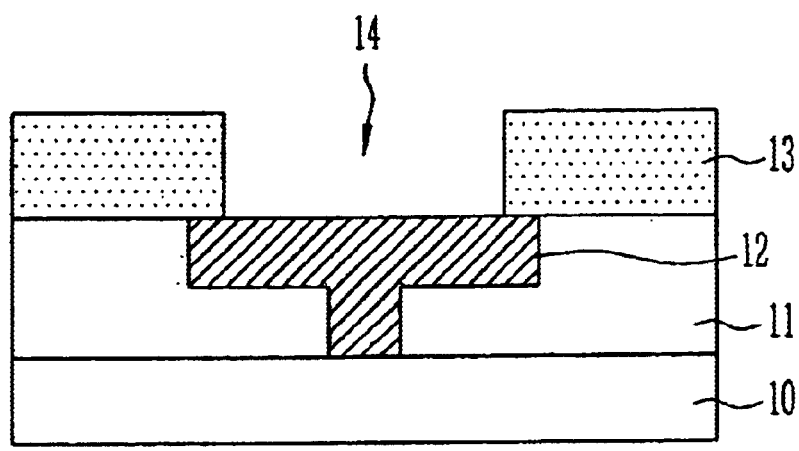

By reference to FIG. 1B, the photoresist is covered on the entire structure including the lower copper electrode 12. A photoresist pattern 13 having a capacitor hole 14 though which the lower copper electrode 12 is exposed is then In the above, the photoresist pattern 13 is formed using all of the photoresists used in the semiconductor manufacture process, including silicon-containing resist.

Figure 1C:
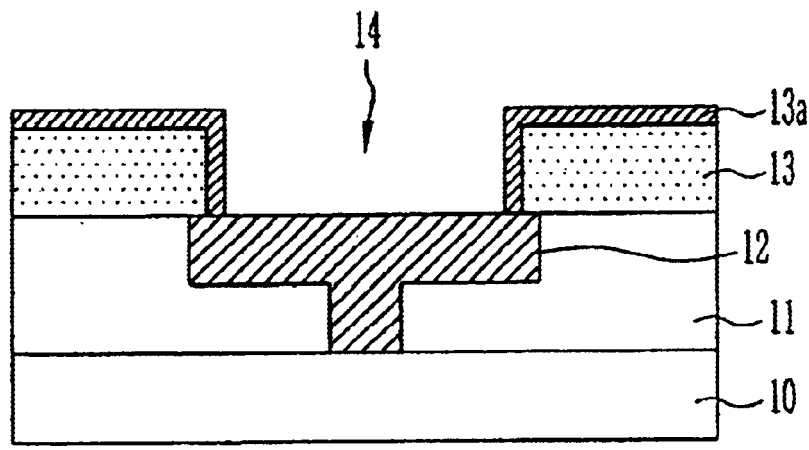

Referring to FIG. 1C, the surface of the photoresist pattern 13 is hardened to form a photoresist hardening layer 13a.

In the above, the photoresist hardening layer 13a is formed by hardening it so that the photoresist hardening layer 13a has the resisting force against subsequent deposition process and chemical mechanical polishing process. At this time, the hardening method may include hardening the surface of the photoresist pattern 13 with action with OH radical formed on the surface of the photoresist and a silylation agent by performing silylation process in a state that the photoresist pattern 13 is formed. Also, the hardening method may include hardening the surface of the photoresist pattern 13 by surface treatment by means of $O_2$ ashing process in a state that the photoresist pattern 13 is formed. At this time, the silylation process is performed at a temperature of 50~300° C. using silicon series compound such as HMDS (hexamethyldisilazane), TMDS (tetramethyldisilazane), B(DMA)MS (bisdimethylaminomethyldilane), and the like.

Figure 1D:
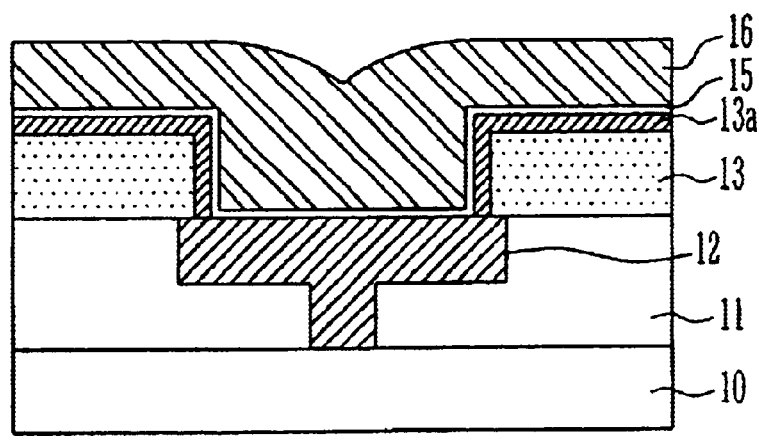

Referring to FIG. 1D, a capacitor dielectric film 15 is formed along the surface of the photoresist hardening layer 13a including the lower copper electrode 12 exposed through the capacitor hole 14. An upper electrode material layer 16 is then formed on the capacitor dielectric film 15 so that the capacitor hole 14 of the photoresist pattern 13 is sufficiently filled.

In the above, the capacitor dielectric film 15 may be formed using oxide, nitride, oxynitride, and materials similar to them. Further, the upper electrode material layer 16 may be formed using Ti, TiN, Ta, TaN, and materials similar to them.

Figure 1E:
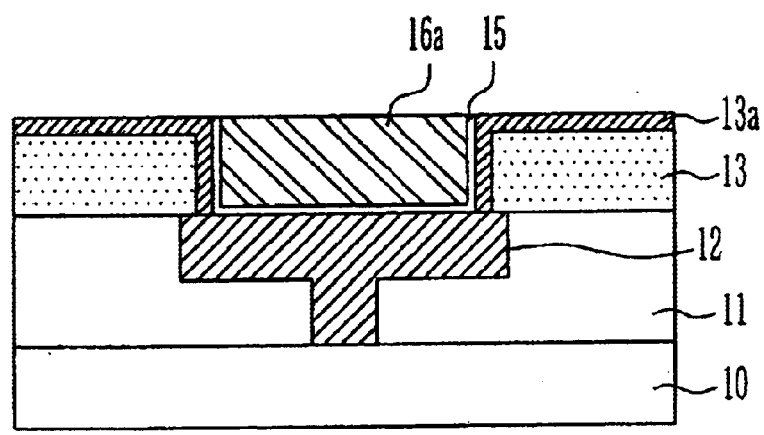

By reference to FIG. 1E, the upper electrode material layer 16 and the capacitor dielectric film 15 are polished by means of chemical mechanical polishing process until the top surface of the photoresist hardening layer 13a is exposed, thus forming an upper electrode 16a within the capacitor hole 14.

In the above, the polishing process may be performed in order to selectively remove the upper electrode material layer 16 and the capacitor dielectric film 15 or sequentially removed them.

Figure 1F:
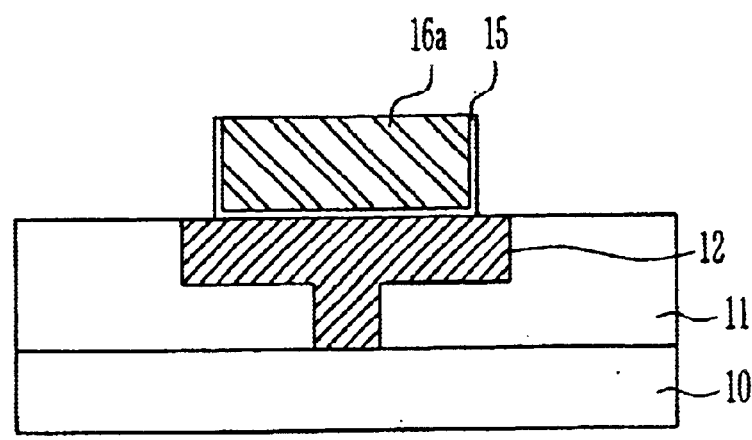

Referring to FIG. 1F, the photoresist pattern 13 including the photoresist hardening layer 13a is removed through ashing process or wet etching process, thereby completing a MIM capacitor.

As described above, according to the present invention, the MIM capacitor using copper as the lower electrode is formed by means of the chemical mechanical polishing process without using the mask process and the etch process. Therefore, the present invention has advantageous effects that it can prevent decrease in the reliability and yield of the device due to etch damage of the lower copper electrode and increase the process stability and reproducibility.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of manufacturing a capacitor in semiconductor devices, comprising the steps of:

forming a lower copper electrode on a substrate;

forming a photoresist pattern having a capacitor hole through which the lower copper electrode is exposed;

hardening the surface of the photoresist pattern to form a photoresist hardening layer;

forming a capacitor dielectric film and an upper electrode material layer on the photoresist hardening layer including the capacitor hole;

polishing the upper electrode material layer and the capacitor dielectric film by means of chemical mechanical polishing process to form an upper electrode within the capacitor hole; and removing the photoresist pattern including the photoresist hardening layer.

2. The method as claimed in claim 1, wherein the photoresist pattern is formed using a photoresist used in a semiconductor manufacture process including silicon-containing resist.

3. The method as claimed in claim 1, wherein the photoresist hardening layer is formed by performing silylation process with the photoresist pattern formed.

4. The method as claimed in claim 3, wherein the silylation process is performed at a temperature of 50~300° C. using silicon series compounds of HMDS, TMDS and B(DMA)MS.

5. The method as claimed in claim 1, wherein the photoresist hardening layer is surface-treated by means of $O_2$ ashing process with the photoresist pattern formed.

6. The method as claimed in claim 1, wherein the capacitor dielectric film is formed using oxide, nitride, oxynitride and materials similar to them.

7. The method as claimed in claim 1, wherein the upper electrode material layer is formed using Ti, TiN, Ta, TaN and materials similar to them.

* * * * *